(12) United States Patent
Vocurek et al.

(10) Patent No.: US 11,561,115 B2
(45) Date of Patent: Jan. 24, 2023

(54) SENSOR DEVICE AND METHOD

(71) Applicant: Infineon Technologies AG, Neubiberg (DE)

(72) Inventors: Dragos Vocurek, Bucharest (RO); Hans-Joerg Wagner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 62 days.

(21) Appl. No.: 17/111,725

(22) Filed: Dec. 4, 2020

(65) Prior Publication Data
US 2021/0172765 A1 Jun. 10, 2021

(30) Foreign Application Priority Data

Dec. 5, 2019 (DE) .......................... 102019133128.5

(51) Int. Cl.
| G01D 5/24 | (2006.01) |
| G01D 5/00 | (2006.01) |
| G01D 5/244 | (2006.01) |
| G01D 5/20 | (2006.01) |
| G04F 10/10 | (2006.01) |
| G01R 33/07 | (2006.01) |
| G01R 33/00 | (2006.01) |

(52) U.S. Cl.
CPC ......... *G01D 5/2448* (2013.01); *G01D 5/2033* (2013.01); *G01R 33/0023* (2013.01); *G01R 33/07* (2013.01); *G04F 10/10* (2013.01)

(58) Field of Classification Search
CPC ............... G01D 5/2448; G01D 5/2033; G01R 33/0023; G01R 33/07
See application file for complete search history.

(56) References Cited

U.S. PATENT DOCUMENTS

| 7,800,389 B2 * | 9/2010 | Friedrich | ....... G01R 31/318511 |
| | | | 324/750.3 |
| 9,625,534 B2 * | 4/2017 | Cadugan | ............ G01R 33/0023 |
| 2017/0176566 A1 | 6/2017 | Monreal et al. | |
| 2019/0391212 A1 * | 12/2019 | Rubinsztain | ....... G01R 33/0029 |

FOREIGN PATENT DOCUMENTS

DE 112010000848 B4 4/2018

* cited by examiner

Primary Examiner — Reena Aurora
(74) Attorney, Agent, or Firm — Harrity & Harrity, LLP

(57) ABSTRACT

Sensor devices and corresponding methods are provided. When a signal path output (COMP OUT) indicates no threshold crossings, diagnosis is performed with a timing based on a clock. In case threshold crossings are indicated, diagnosis is performed with a timing based on threshold crossings.

20 Claims, 4 Drawing Sheets

SENSOR DEVICE AND METHOD

RELATED APPLICATION

This application claims priority to German Patent No. 102019133128.5, filed on Dec. 5, 2019, which is incorporated herein by reference in its entirety.

FIELD

The present application relates to sensor devices and corresponding methods. In some implementations, the application relates to diagnosis of sensor devices and timing of such diagnosis.

BACKGROUND

Sensor devices are used in various applications to measure a physical quantity and output a signal representative of the physical quantity to further devices. Such sensor devices are for example used in control loops to control an apparatus based on the signal output from a sensor device or for monitoring correct operation of an apparatus.

An example for sensor devices are magnetic field sensor devices, where the physical quantity is a magnetic field. Such magnetic field sensor devices typically comprise a magnetic field sensor like a Hall sensor or a sensor based on magnetoresistive effect (xMR sensor), signal processing circuitry like filters or amplifiers and an output stage which generates an output signal to be transmitted to further devices like a controller. Such magnetic field sensor devices may be used to detect and measure a movement like a rotary movement or a linear movement. For such application, a magnet arrangement is provided to a moving part (like a rotary shaft or a linearly moving element) which, at the position of the magnetic field sensor device, generates a modulated magnetic field when moving.

Such magnetic field sensor devices are for example used in automotive applications to measure rotational speeds like a wheel speed or a speed of a motor like an electric motor in an electric or hybrid vehicle. Other applications of such magnetic sensor devices include magnetic switches, used for example for wipers systems or window lifters in automotive applications.

Such applications in the automotive field or other fields may be safety-critical, for example important for safe operation of an automobile or parts thereof. In such safety critical applications, it may be desirable or even required that the correct operation of the sensor device is monitored by a diagnosis circuit to be able to detect a fault of the sensor device.

Such a diagnosis or monitoring should not influence the measurement of the physical quantity by the sensor device.

In some conventional solutions, operation of a magnetic field sensor device is switched continuously (in intervals determined for example by some clock signal) between normal operation for measuring the physical quantity and a diagnosis mode where a diagnosis of the sensor device is performed. However, such an approach may introduce or increase sampling jitter when an internal sampling of the sensor signal is switched between normal operation and diagnosis mode. For some applications and sensor devices this sampling jitter may be a significant disturbance of the signal output by the sensor device.

SUMMARY

A sensor device as defined in claim 1 and a method as defined in claim 12 are provided. The dependent claims define further embodiments.

According to an embodiment, a sensor device is provided, including:
a signal path configured to generate a signal path output indicative of threshold crossings of a sensor signal;
a diagnosis circuit configured to perform a diagnosis of at least part of the sensor device; and
a diagnosis logic configured to control the diagnosis circuit to perform diagnosis with a timing based on a clock in case the signal path output indicates no threshold crossings, and to control the diagnosis circuit to perform diagnosis with a timing based on the threshold crossings in case the output is indicative of threshold crossings.

According to another embodiment, a method for a sensor device diagnosis is provided, including:
performing a diagnosis of at least part of the sensor device with a timing based on a clock in case a signal path output of the sensor device does not indicate threshold crossings of a sensor signal; and
performing a diagnosis of at least part of the sensor device according to a timing based on threshold crossings in case the signal path output indicates threshold crossings of the sensor signal.

The above summary is merely intended to give a brief overview over some embodiments and is not to be construed as limiting in any way.

DETAILED DESCRIPTION

In the following, various embodiments will be described in detail referring to the attached drawings. These embodiments are given for illustrative purposes only and are not to be taken in a limiting sense. For example, while an embodiment may be described as comprising a plurality of features (for example components, acts, events, elements etc.), in other embodiments, some of these features may be omitted and/or may be replaced by alternative features.

Furthermore, in addition to the features explicitly shown and described, other features, for example features used in conventional sensor devices and associated methods, may be provided.

In this respect, embodiments discussed herein relate to the timing of a diagnosis in sensor devices. The diagnosis itself as well as the sensor device may be implemented in any conventional manner and will therefore be described only briefly.

Features from different embodiments may be combined to form further embodiments unless noted otherwise. Variations or modifications described with respect to one of the embodiments may also be applied to other embodiments and will therefore not be described repeatedly.

Embodiments discussed in the following use magnetic field sensor devices as an example for sensor devices. However, techniques discussed herein may also be applied to other sensor devices, in particular sensor devices where a sensed physical quantity may pass threshold values repeatedly (for example physical quantities having an oscillating-like behavior), for example current sensors or voltage sensors.

Figure 1:
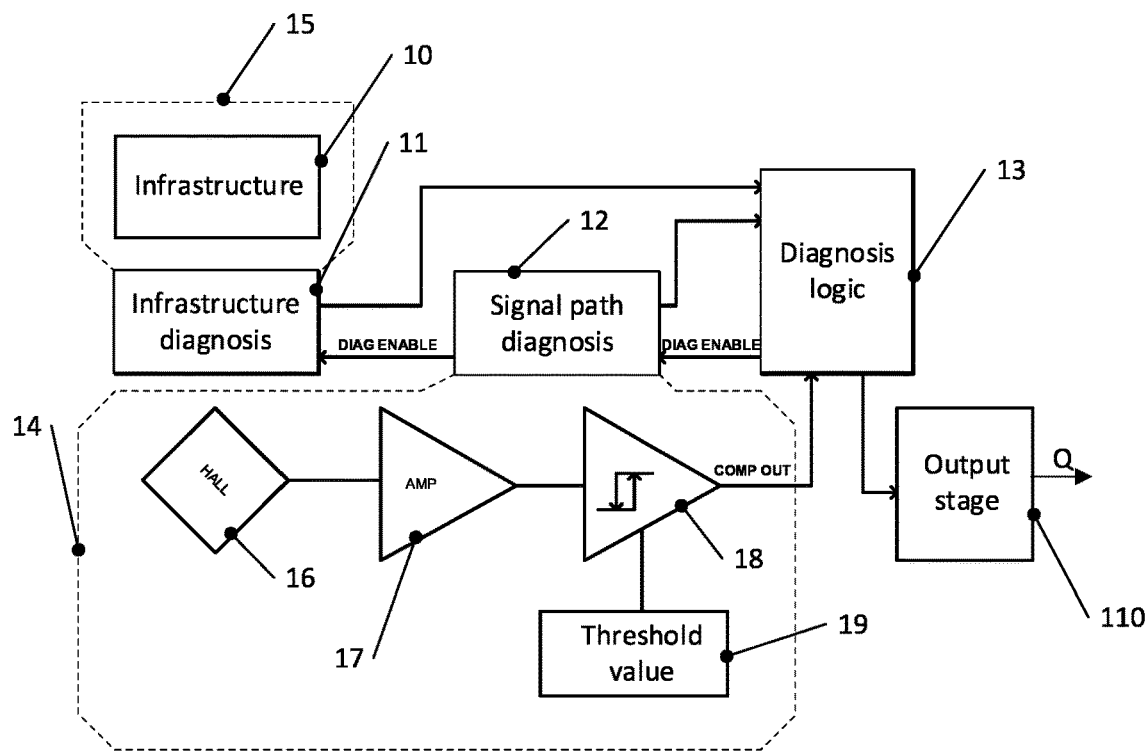
FIG. 1 is a block diagram illustrating a sensor device according to some embodiments.

Turning now to the figures, FIG. 1 is a block diagram illustrating a sensor device according to an embodiment.

The sensor device of FIG. 1 comprises infrastructure 10 and a signal path 14. Infrastructure relates to components of the sensor device which contributes to the operation of the sensor device, e.g., signal path 14, but are not part thereof. Non-limiting examples for such infrastructure components comprise supply circuits supplying the signal path with power and/or bias voltages or currents, registers for storing information or protection circuits against electrostatic discharge (ESD protection).

Signal path 14 in the embodiment of FIG. 1 comprises a Hall plate 16 as an example for a magnetic field sensor. Hall plate 16 may be operated according to so-called spinning current techniques, where terminals used for biasing the Hall sensor and terminals for tapping a Hall voltage are switched over time. As this is a conventional technique for operating Hall plates, it will not be described in detail here. The required biasing for such a spinning current technique may be performed by infrastructure 10. Instead of a Hall sensor, other kinds of magnetic field sensors may be used like magnetic field sensor based on magnetoresistive effects like giant magnetoresistance (GMR) or tunneling magnetoresistance (TMR). Such sensors are generically referred to as xMR sensors.

An output of Hall plate 16 is provided to an amplifier 17 for amplification. An output of amplifier 17 is provided to a comparator 18, which detects crossing of a threshold value 19 by the output signal of amplifier 17. "Crossing" may refer both to a crossing of the threshold value coming from lower values than the threshold value and a crossing of the threshold value coming from values higher than the threshold value. In some embodiments, the threshold value 19 may be zero, such that comparator 18 detects zero crossings. In case of a speed sensor as described in the background portion, a frequency of such threshold crossings like zero crossings may correspond to speed of a device (for example rotary speed or linear movement). It should be noted that the components shown for signal path 14 are merely examples, and other components like filters may also be provided.

An output of comparator 18 is provided to a diagnosis logic 13. Diagnosis logic 13 may be implemented in any suitable manner for performing and controlling the functions discussed herein, for example using an application specific integrated circuit (ASIC), logic circuitry, a field programmable gate array or any other suitable logic circuit. Based on the output signal COMP OUT from comparator 18, diagnosis logic 13 provides a signal to an output stage 110, which then outputs a signal Q to the process by further devices.

Furthermore, based on signal COMP OUT, diagnosis logic 13 enables, i.e. activates, an infrastructure diagnosis circuit 11 and/or a signal path diagnosis circuit 12 using signals DIAG ENABLE. Infrastructure diagnosis circuit 11, when activated, monitors or tests infrastructure 10. For example, bias voltages provided by infrastructure 10 may be measured and compared to expected values. The diagnosis of infrastructure diagnosis circuit 11 is indicated by a dashed line 15.

Signal path diagnosis circuit 12 when activated performs a diagnosis of signal path 14, for example by injecting test signals in the signal path, for example between Hall sensor 16 and amplifier 17 or between amplifier 17 and comparator 18, and monitoring the output signal COMP OUT in response to these test signals. Such and other diagnosis techniques may be implemented in any conventional manner to detect faults. A fault, in the context of the present application, relates to any state not according to the norm or expected state that may be detected by the diagnosis, and encompasses transient faults or permanent faults, depending on the implementation of infrastructure diagnosis circuit 11 and signal path diagnosis circuit 12. Techniques discussed herein below focus on the timing of the diagnosis (i.e. when to enable infrastructure diagnosis circuit 11 and signal path diagnosis circuit 12), while the diagnosis itself may then be implemented in a conventional manner.

In embodiments, when no threshold crossings are indicated by signal COMP OUT (for example when an apparatus the movement of which is to be measured does not move), the diagnosis is performed in intervals determined by a clock signal, for example in regular intervals. When threshold value crossings are indicated by signal COMP OUT, the timing of the diagnosis is based on the threshold crossings. For example, a diagnosis may be performed after each threshold crossing in such a case.

Figure 2:
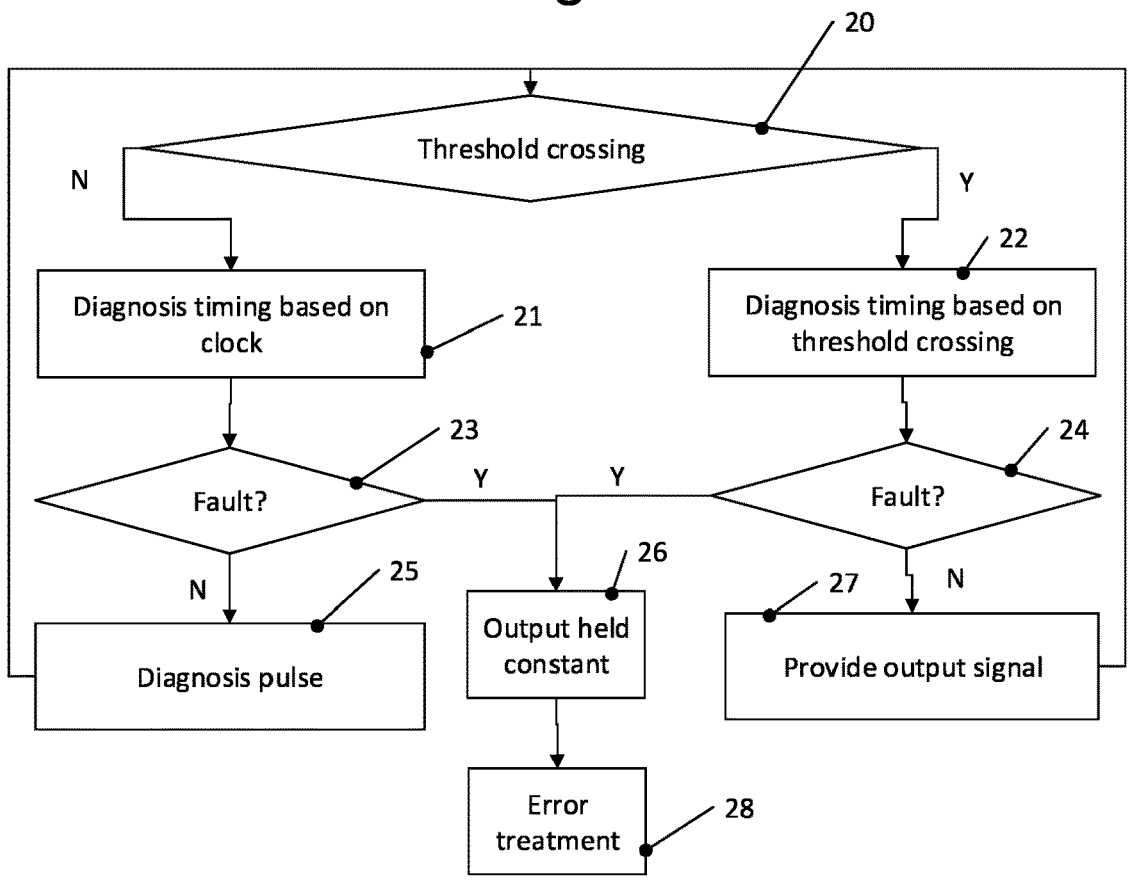
FIG. 2 is a flowchart illustrating a method according to some embodiments.

Examples for the timing for diagnosis briefly described above will now be described in more detail referring to FIGS. 2 to 6. FIG. 2 is a flowchart illustrating a method according to an embodiment, and FIGS. 3 to 6 are signal timing diagrams showing example signals that will be used to illustrate the method of FIG. 2 further. The method of FIG. 2 may be implemented using diagnosis logic 13 of FIG. 1, but is not limited thereto. For ease of illustration, the method of FIG. 2 will be explained also referring to FIG. 1, but it is to be understood that the method may also be implemented in other sensor devices. Furthermore, it should be noted that signal waveforms shown in FIGS. 3 to 6 are merely examples, and depending on the implementation of a sensor device and the behavior of a physical quantity to be measured signal waveforms may vary from the waveforms shown in FIGS. 3 to 6.

At 20 in FIG. 2, the method comprises detecting if there are threshold crossings in a sensor output signal. For example, in FIG. 1 diagnosis logic 13 detects if there are zero crossings indicated by signal COMP OUT. Depending on whether there are threshold crossings or not, the diagnosis timing is different. First, the case where there are no threshold crossings ("N" at 20) will be discussed.

In this case, at 21, a diagnosis timing based on a clock, for example in regular intervals based on some clock signal, is performed. For illustration, FIG. 3 shows example signals for better illustration.

Figure 3:
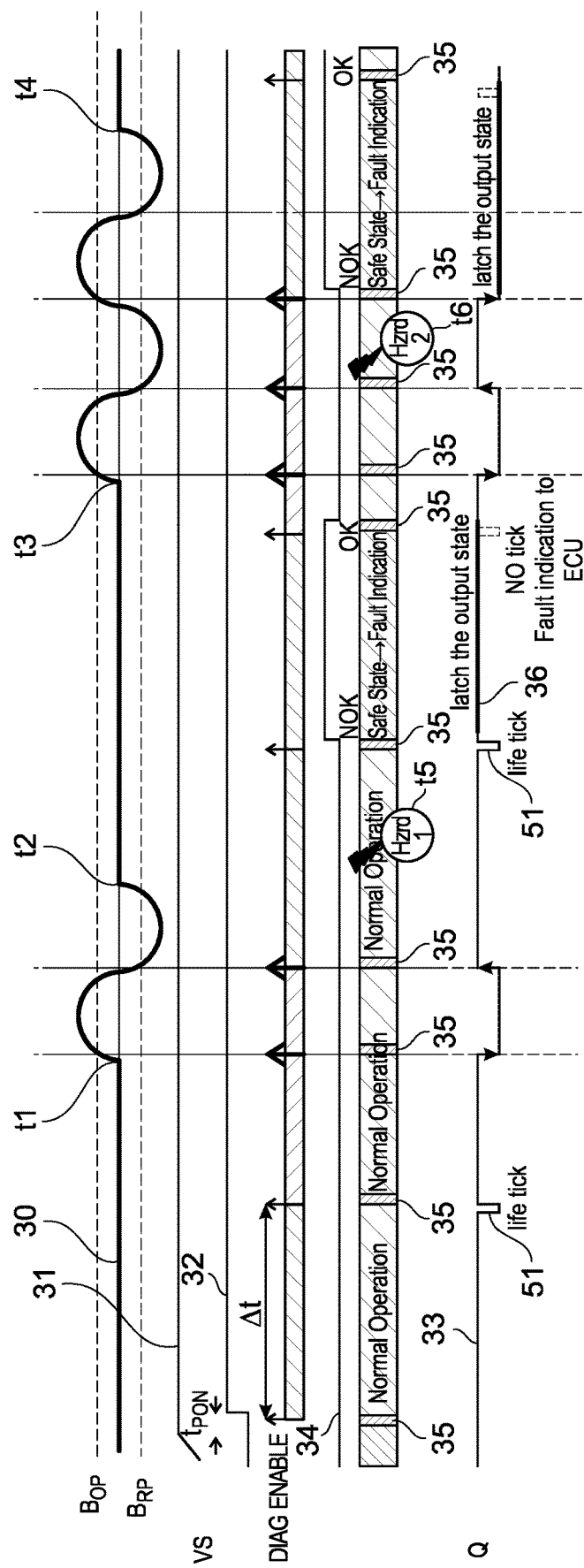
FIG. 3 is a timing diagram illustrating signals in some embodiments.

In FIG. 3, a curve 30 illustrates an example magnetic field over time. A curve 31 illustrates a supply voltage. At startup, the supply voltage is ramped up and after a certain delay $t_{Pon}$ operation start, as illustrated by a curve 32.

Up to a time t1, the magnetic field according to 30 remains constant, and no threshold crossings are detected (at 20 in FIG. 2). Such a constant magnetic field may for example occur because an apparatus, a movement of which is to be measured using a magnetic field sensor, does not move. As mentioned, then at 21 the diagnosis timing is based on a clock. For example, in FIG. 3 the diagnosis is enabled (DIAG ENABLE) at times marked by arrows, and in the state where no threshold occurs, diagnosis is enabled in regular intervals with a time distance $\Delta t$. $\Delta t$ may for example correspond to a so-called tick period (lowest frequency available in a system), for example corresponding to a frequency of 10 to 100 Hz.

Each time the diagnosis is enabled, a diagnosis as performed, as indicated by boxes 35 in FIG. 3. Between the diagnoses, as long as no fault occurs, normal operation is performed, i.e. the sensor device senses the physical quantity, in this case the magnetic field.

At 23 in FIG. 2, the method comprises checking of the diagnosis results in a fault. For example, numeral 34 in FIG. 3 designates an output signal of infrastructure diagnosis circuit 11 and/or signal path diagnosis circuit 12 which, in a low state, indicates that no fault has occurred and in a high state indicates that a fault has occurred.

When no fault occurs (N at 23), the method of FIG. 2 at 25 comprises sending a diagnosis pulse, also referred to as life tick herein, at an output. As an example, in FIG. 3 a diagnosis pulse 51 is sent after the diagnosis has indicated that there is no fault at the time of the next diagnosis. For example, the diagnosis pulses at 25 may always be sent at the beginning of the next diagnosis. In other embodiments, other timings are possible. For example, diagnosis pulses may be sent at the end of the diagnosis if no fault occurs. An example for this alternative timing will be explained further below. These diagnosis pulses or life ticks are short pulses which may have a smaller duration than an actual signal occurring when there are threshold crossings, which will be explained further below. For example, a duration may be of the order of 10 µs, for example between 5 and 20 µs, in some implementations. As long as these diagnosis pulses are received by an entity like a control unit (e.g. an ECU in an automotive environment) coupled to the sensor device, the entity knows that the diagnosis resulted in no faults. Therefore, the entity is informed about the correct functioning (according to the diagnosis) of the sensor device even in times where there are no threshold crossings.

After the diagnosis pulse has been sent at 25, the method of FIG. 2 reverts to 20, and as long as no threshold crossings are detected and no faults occur, the actions at 21 to 35 are performed and diagnosis pulses are sent in regular intervals.

Next, a case where threshold crossings are detected at 20 will be discussed. In this case (Y at 20), the diagnosis timing is based on threshold crossings.

As an example, in FIG. 3 at a time t1, the magnetic field starts to oscillate, which may for example be caused by an apparatus starting to move. In this case, the threshold crossings are detected. As an example, in FIG. 3 the value of the magnetic field in the constant case up to t1 is used as a threshold value, which may be zero or some offset magnetic field. In the example of FIG. 3, the diagnosis is enabled always at or a short time after the threshold crossings. For example, the diagnosis may be activated on a next edge, e.g. rising edge, of a clock signal (e.g. a digital clock signal clocking diagnosis logic 13 of FIG. 1). This may lead to time delays of the order of 100 ns to 1 µs between the threshold crossing and activation of diagnosis in some implementations, depending on the clock frequency.

At 24, the method comprises checking if a fault occurs. If this is not the case (N at 24), the method comprises providing an output signal based on the sensor output. For example, in FIG. 3 between t1 and t2, the output signal Q changes its state with each threshold crossing. The duration of the diagnosis at 35 in this case is much shorter than a shortest period of the output signal according to curve 33.

Figure 4:
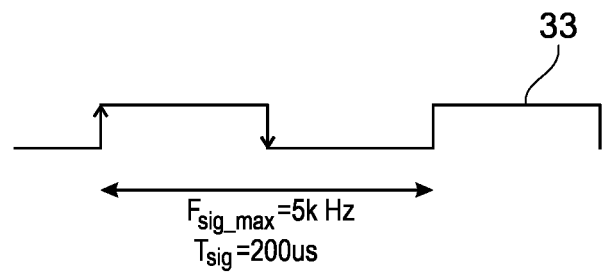
FIGS. 4, 5A, 5B, and 6 are further timing diagrams to illustrate operation of some embodiment further.

This is illustrated in more detail in FIG. 4. FIG. 4 illustrates a portion of the output signal 33 where a varying magnetic field with oscillation occurs and therefore threshold crossings are detected. As mentioned, with each threshold crossing the state of the output signal according to curve 33 changes. In the example of FIG. 4, a maximum frequency of the thus generated signal is 5 kHz, corresponding to a period length of 200 µs. Depending on the implementation, also other maximum frequencies corresponding to minimum period length may occur. It should be noted that this maximum frequency or minimum period length in many applications is known by the design of an apparatus including the sensor device. For example, when the sensor device is used to measure the angular speed of a wheel of a vehicle, a maximum speed of the vehicle and hence, a maximum rotational speed, which translates to a maximum frequency, is known by design. Likewise, for a motor, a maximum number of revolutions per minute (RPM) according to rotor design is known, which translates to a maximum frequency.

Instead of performing a diagnosis after each threshold crossing, a diagnosis may also be performed after n threshold crossings, n>1, for example after every other threshold crossing, after every third threshold crossing etc.

The duration of the diagnosis at 35 is selected to be significantly shorter than this period, for example at least two times shorter, at least five times shorter or at least 10 times shorter. In such implementations, when the diagnosis is triggered following a threshold crossing as explained above, it is ensured that the diagnosis is terminated before the next threshold crossing. In the example of FIG. 4, the duration of the diagnosis is about 20 µs, i.e. an order of magnitude shorter than the minimum time period. In this way, in some implementations no additional jitter is introduced by the diagnosis into the output signal Q. In some implementations, output jitter then may be due only to thermal noise effects. Also, the duration of the diagnosis pulses 51, as explained above, is chosen to be shorter than the maximum time period, such that these diagnosis pulses may be distinguished from the signal occurring when threshold pulses occur. For example, the duration of the diagnosis pulses may be shorter than ½ of the maximum period length occurring, shorter than ⅕ of the maximum period length or shorter than ⅒ of the maximum period length.

After providing the output signal, at 27 the method reverts to 20. As long as threshold crossings occur and no fault occurs, the output signal is continued to be provided, according to the acts at 22, 24 and 27 I FIG. 2.

Next, operation in case a fault occurs at 23 or 24 is performed. In case a fault occurs, the output is held constant. The constant output state is for example present at 36 in FIG. 3. This means that no diagnosis pulse (25 in FIG. 2) is output, or that the output signal (27 in FIG. 2) is "frozen". By receiving a constant output without diagnosis pulses or other state changes, an entity receiving the output signal can determine that a fault has occurred.

Following this, some fault treatment occurs at 28. For example, diagnosis may nevertheless be continued repeatedly (based on a clock at 21 or based on threshold crossings at 22), and if a next diagnosis results in no fault being detected, the fault state may be terminated, and normal operation may be resumed. In other implementations, some actions for example from an operator may be necessary to reset the fault state to normal operation. In other embodiments, for example the output of the sensor device may be disregarded in operation, or an output from a redundant sensor device may be used. The exact fault handling may depend on the respective application of the sensor device and any conventional approaches for fault handling may be used.

Figure 5A:
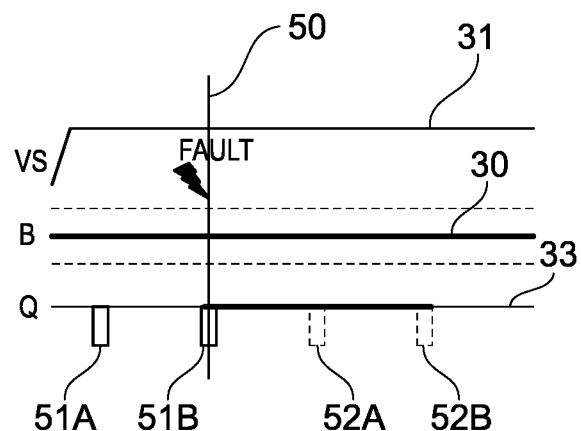
Figure 5B:
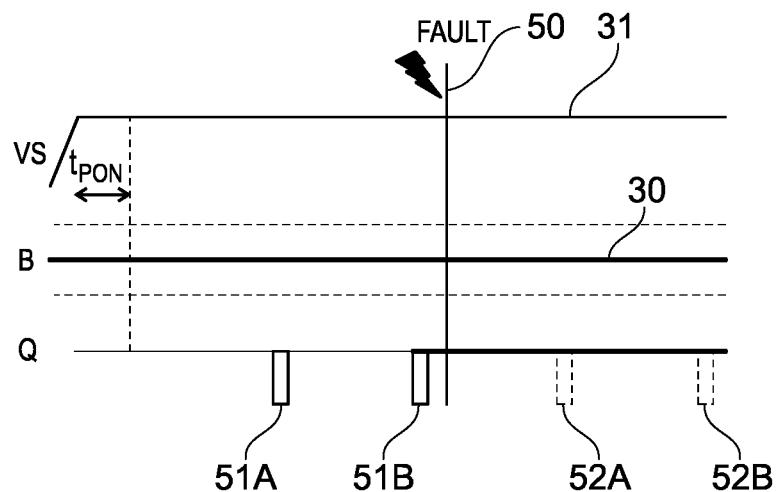
Figure 6:
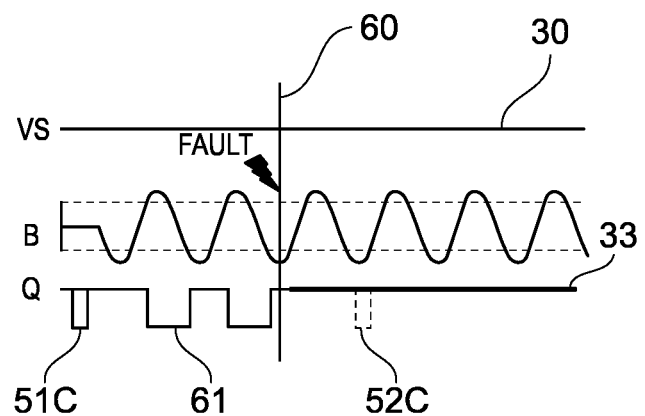

These fault cases (Y at 23 and Y at 24) will now be further illustrated referring to FIGS. 3, 5 and 6.

In FIG. 3, after a time t2, no further threshold crossings in the magnetic field occur (for example because a corresponding apparatus has stopped moving), and a diagnosis timing based on a clock signal (21 in FIG. 2) is performed. Furthermore, in the example of FIG. 3, at a time t5 a fault occurs.

This fault is detected in the following diagnosis 35. In embodiments where the diagnosis pulses are sent for example at the beginning of diagnosis, this means that at this diagnosis still a diagnosis pulse 51 is sent. However, then following the diagnosis at 35, at 26 in FIG. 2 the output is held constant such that at a next diagnosis 35 no diagnosis pulse is sent, such that a further entity receiving signal Q may detect the fault. In other embodiments as mentioned the diagnosis pulse may be sent at the end of diagnosis. In such embodiments, a faster detection of a fault by an entity receiving the diagnosis pulses may be possible.

In some embodiments, if in this next diagnosis 35, the fault is not present any longer (for example a transient fault), the fault signal 34 goes down again, and normal operation continues. As already mentioned above, in other implementations a different fault treatment may be performed at 28.

FIG. 5A also illustrates operation in case no threshold crossings occur. Here, curve 30 as in FIG. 3 represents the magnetic field, and curve 31 represents the supply voltage. As no threshold crossings occur in this example (constant magnetic field), this corresponds to the no "N" branch at 20 and the handling explained with reference to 21, 23 and 25 in FIG. 2. In FIG. 5A, it is assumed that at a time denoted by a vertical line 50 a fault occurs. Before that, the diagnosis pulses are transmitted at 25, where as an example two diagnosis pulses 51A, 51B are shown. Following the fault, the output is held constant and no diagnosis pulses (which otherwise without a fault would have been sent at positions denoted by 52A and 52B) are sent, such that an entity receiving the output signal 33 can recognize that a fault has occurred.

FIG. 5B is a variation of FIG. 5A and illustrates the behavior in embodiments where diagnosis pulses are sent following the diagnosis in case no fault was detected. The reference numerals correspond to the ones in FIG. 5A.

Here, the fault occurring at 50 is detected at a next diagnosis (before the position 52A). As here the diagnosis pulse would be sent after the diagnosis and a fault is detected, no pulse is sent at position 52A. In embodiments where diagnosis pulses are at the beginning of the diagnosis as in FIG. 3, at position 52A a diagnosis pulse would be still sent, and only at position 52B no diagnosis pulse would be sent.

Therefore, in case of FIG. 5B where diagnosis pulses are sent after each diagnosis, an entity receiving the diagnosis pulses can detect that a fault has occurred up to about the time Δt between (see FIG. 3) earlier.

Next, examples for an occurrence of a fault during the diagnosis timing based on threshold crossing (Y at 24 in FIG. 2) will be discussed.

In FIG. 3, at a time t3 oscillations in the magnetic field 30 begin again, for example due to a corresponding apparatus moving again.

At this point, the fault signal 34 is down again, such that diagnosis 35 are carried out with a timing based on the threshold crossings for example initiated with or shortly after each threshold crossing, as already explained previously. At a time t6 a fault occurs. At the next diagnosis 35 following time t6 the fault signal 34 goes up, and at 26 the output is held constant. Therefore, in this case the output is held at a low state, as the last state of the output signal 33 before the fault was detected was low. No diagnosis pulses are sent until the fault treatment has led to a resuming of normal operation, for example when further diagnosis shows that no faults occur any longer or due to intervention by an operator, as mentioned above.

FIG. 6 shows again the handling for the case where threshold crossings occur. In FIG. 6, after a diagnosis pulse 51C, oscillations start in the magnetic field 31, and as indicated by numeral 61 a corresponding output signal is provided. Diagnosis timing is determined by threshold crossings, as also already explained. At a time marked by a vertical line 60, a fault occurs.

Following this, the output 33 is held constant (also referred to as latched), and in particular no diagnosis pulses (for example 52C in FIG. 6) or other state changes are provided in the output signal. In this way, an entity receiving signal 33 may detect that a fault has occurred.

As can be seen from the above examples, with techniques discussed herein a single output signal is used both for transmitting information obtained from the sensor (the changing states or the output signal when the magnetic field changes, for example between times t1 and t2 in FIG. 3 or before the fault occurs at 60 in FIG. 6) and information regarding information that a fault has occurred (by holding the output state constant).

Figure 7:
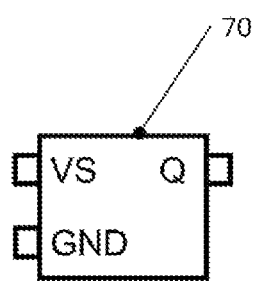
FIG. 7 is a schematic view of a sensor device according to an embodiment.

This makes an implementation of a sensor device with few pins possible. An example sensor device 70 is shown in FIG. 7. Sensor device 70 is provided in a package having three pins, one for receiving a positive supply voltage VS, one to be connected to ground GND, and one for providing the output signal Q. Nevertheless, in other embodiments a separate output may be provided for indicating a fault, for example by providing the internal fault signal 34 of FIG. 3 also to an output. In yet other embodiments, 2-wire devices with current interfaces, which use the same pins for supply and signaling, may be used.

Some embodiments are defined by the following examples:

Example 1. A sensor device, comprising:
a signal path configured to generate a signal path output indicative of threshold crossings of a sensor signal,
a diagnosis circuit configured to perform a diagnosis of at least part of the sensor device, and
a diagnosis logic configured to control the diagnosis circuit to perform diagnosis with a timing based on a clock in case the signal path output indicates no threshold crossings, and configured to control the diagnosis circuit to perform diagnosis with a timing based on the threshold crossings in case the signal path output is indicative of threshold crossings.

Example 2. The sensor device of example 1, wherein the timing based on a clock comprises performing a diagnosis in regular intervals.

Example 3. The sensor device of example 1 or 2, wherein the timing based on threshold crossings comprises performing a diagnosis following each n-th threshold crossing, wherein n is an integer number equal to or greater than 1.

Example 4. The sensor device of any one of examples 1 to 3, wherein a time duration for a diagnosis is shorter than a minimum period length of the threshold crossings.

Example 5. The sensor device of any one of examples 1 to 4, wherein the diagnosis logic is configured to hold a first output of the sensor device constant if the diagnosis circuit detects a fault.

Example 6. The sensor device of any one of examples 1 to 5, wherein the diagnosis logic is configured to, in a case in which the signal path output indicates no threshold crossings and the diagnosis circuit indicates no fault, to output diagnosis pulses based on the clock at a second output of the sensor device.

Example 7. The sensor device of any one of examples 1 to 6, wherein the sensor device is configured to provide an output signal indicative of the threshold crossings at a third output of the sensor device in a case in which the signal path output indicates threshold crossings and the diagnosis circuit does not detect a fault.

Example 8. The sensor device of example 5, of example 6 and of example 7, wherein the first output, the second output and the third output are the same output.

Example 9. The sensor device of any one of examples 1 to 8, wherein the diagnosis circuit comprises a signal path diagnosis circuit configured to perform a diagnosis of the signal path.

Example 10. The sensor device of any one of examples 1 to 9, further comprising a sensor device infrastructure, wherein the diagnosis circuit comprises an infrastructure diagnosis circuit configured to perform a diagnosis of the infrastructure.

Example 11. The sensor device of any one of examples 1 to 10, wherein the sensor device is a magnetic field sensor device.

Example 12. A method for sensor device diagnosis, comprising:

performing a diagnosis of at least part of the sensor device with a timing based on a clock in case a signal path output of the sensor device does not indicate threshold crossings of a sensor signal, and performing a diagnosis of at least part of the sensor device according to a timing based on threshold crossings if the signal path output indicates threshold crossings.

Example 13. The method of example 12, wherein the timing based on a clock comprises performing a diagnosis in regular intervals.

Example 14. The method of example 12 or 13, wherein the timing based on threshold crossings comprises performing a diagnosis following each n-th threshold crossing, wherein n is an integer number equal to or greater than 1.

Example 15. The method of any one of examples 12 to 14, wherein a time duration for a diagnosis is shorter than a minimum period length of the threshold crossings.

Example 16. The method of any one of examples 12 to 15, further comprising holding a first output of the sensor device constant if the diagnosis detects a fault.

Example 17. The method of any one of examples 12 to 16, further comprising, in a case where the signal path output indicates no threshold crossings and the diagnosis circuit indicates no fault, outputting diagnosis pulses based on the clock at a second output of the sensor device.

Example 18. The method of any one of examples 12 to 17, further comprising providing an output signal indicative of the threshold crossings at a third output of the sensor device when the signal path output indicates threshold crossings and the diagnosis does not detect a fault.

Example 19. The method of example 16, of example 17 and of example 18, wherein the first output, the second output and the third output are the same output.

Example 20. The method of any one of examples 12 to 19, wherein the diagnosis comprises at least one of a signal path diagnosis of a signal path of the sensor device or an infrastructure diagnosis of an infrastructure of the sensor device.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A sensor device, comprising:
a signal path configured to receive a sensor signal, the signal path comprising a comparator circuit configured to compare the sensor signal to at least one threshold and generate a signal path output indicative of threshold crossings of the sensor signal relative to the at least one threshold or indicative of no threshold crossings of the sensor signal relative to the at least one threshold;
a diagnosis circuit configured to receive a first enable signal or a second enable signal and perform at least one diagnosis of at least part of the sensor device in response to being triggered by the first enable signal or the second enable signal; and
a diagnosis logic configured to monitor the signal path output and determine whether the signal path output indicates threshold crossings or no threshold crossings,
in response to determining that the signal path output indicates no threshold crossings, the diagnosis logic is configured to generate the first enable signal and provide the first enable signal to the diagnosis circuit to trigger the diagnosis circuit to perform a first diagnosis at first time intervals defined by a timing of a clock signal, and
in response to determining that the signal path output indicates threshold crossings, the diagnosis logic is configured to generate the second enable signal and provide the second enable signal to the diagnosis circuit to trigger the diagnosis circuit to perform a second diagnosis at second time intervals defined by a timing of the threshold crossings.

2. The sensor device of claim 1, wherein the first time intervals are regular intervals defined by the timing of the clock signal.

3. The sensor device of claim 1, wherein the timing based on the threshold crossings comprises performing the second diagnosis following each n-th threshold crossing, wherein n is an integer number equal to or greater than 1.

4. The sensor device of claim 1, wherein a time duration for the first diagnosis and the second diagnosis is shorter than a minimum period length of the threshold crossings.

5. The sensor device of claim 1, wherein the diagnosis logic is configured to hold a first output of the sensor device constant if the diagnosis circuit detects a fault.

6. The sensor device of claim 5, wherein the diagnosis logic is configured to, in a case in which the signal path output indicates no threshold crossings and the diagnosis circuit indicates no fault, to output diagnosis pulses based on the clock signal at a second output of the sensor device.

7. The sensor device of claim 6, wherein the sensor device is configured to provide an output signal indicative of the threshold crossings at a third output of the sensor device in a case in which the signal path output indicates the threshold crossings and the diagnosis circuit does not detect a fault.

8. The sensor device of claim 7, wherein the first output, the second output, and the third output are the same output.

9. The sensor device of claim 1, wherein the diagnosis circuit comprises a signal path diagnosis circuit configured to perform a diagnosis of the signal path.

10. The sensor device of claim 1, further comprising:
a sensor device infrastructure, wherein the diagnosis circuit comprises an infrastructure diagnosis circuit configured to perform a diagnosis of the sensor device infrastructure.

11. The sensor device of claim 1, wherein the sensor device is a magnetic field sensor device.

12. A method for sensor device diagnosis, comprising:
generating, by a sensor device, a sensor signal;
generating, by the sensor device, a signal path output indicative of threshold crossings of the sensor signal, including comparing the sensor signal to at least one threshold and generating the signal path output indicative of threshold crossings of the sensor signal relative to the at least one threshold;
performing a first diagnosis of at least part of the sensor device with a timing based on a clock signal when the signal path output of the sensor device does not indicate threshold crossings of the sensor signal; and
performing a second diagnosis of at least part of the sensor device according to a timing based on the threshold crossings when the signal path output indicates threshold crossings.

13. The method of claim 12, wherein the timing based on the clock comprises performing the first diagnosis at regular intervals.

14. The method of claim 12, wherein the timing based on the threshold crossings comprises performing the second diagnosis following each n-th threshold crossing, wherein n is an integer number equal to or greater than 1.

15. The method of claim 12, wherein a time duration for the first diagnosis and the second diagnosis is shorter than a minimum period length of the threshold crossings.

16. The method of claim 12, further comprising:
holding a first output of the sensor device constant if the first diagnosis or the second diagnosis detects a fault.

17. The method of claim 16, further comprising:
in a case where the signal path output indicates no threshold crossings and the first diagnosis or the second diagnosis indicates no fault, outputting diagnosis pulses based on the clock signal at a second output of the sensor device.

18. The method of claim 17, further comprising:
providing an output signal indicative of the threshold crossings at a third output of the sensor device when the signal path output indicates the threshold crossings and the second diagnosis does not detect a fault.

19. The method of claim 18, wherein the first output, the second output, and the third output are the same output.

20. The method of claim 12, wherein the first diagnosis and the second diagnosis comprise at least one of a signal path diagnosis of a signal path of the sensor device or an infrastructure diagnosis of an infrastructure of the sensor device.

* * * * *